United States Patent
Richtarch

(10) Patent No.: US 7,060,620 B2
(45) Date of Patent: Jun. 13, 2006

(54) METHOD OF PREPARING A SURFACE OF A SEMICONDUCTOR WAFER TO MAKE IT EPIREADY

(75) Inventor: Claire Richtarch, Grenoble (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 192 days.

(21) Appl. No.: 10/671,812

(22) Filed: Sep. 25, 2003

(65) Prior Publication Data
US 2005/0020084 A1  Jan. 27, 2005

(30) Foreign Application Priority Data
Jul. 23, 2003  (FR) ................... 03 08969

(51) Int. Cl.
*H01L 21/302* (2006.01)
*H01L 21/461* (2006.01)
*H01L 21/469* (2006.01)
*H01L 21/31* (2006.01)

(52) U.S. Cl. ............ 438/692; 438/767; 438/931
(58) Field of Classification Search ........... 438/458, 438/692, 407, 406, 770, 478, 689, 767, 931
See application file for complete search history.

(56) References Cited

U.S. PATENT DOCUMENTS

| | | | |
|---|---|---|---|
| 5,877,070 A * | 3/1999 | Goesele et al. | 438/458 |
| 5,895,583 A * | 4/1999 | Augustine et al. | 216/53 |
| 6,136,727 A * | 10/2000 | Ueno | 438/770 |
| 6,537,606 B1 | 3/2003 | Allen et al. | 427/9 |
| 2002/0061651 A1 * | 5/2002 | Tani et al. | 438/689 |
| 2005/0042800 A1 * | 2/2005 | Yamada et al. | 438/105 |

FOREIGN PATENT DOCUMENTS

| EP | 0 966 034 | 12/1999 |
|---|---|---|
| FR | 02-09869 | 8/2002 |

OTHER PUBLICATIONS

Derwent Acc. No. 1996-007979, Fuji Electric Co LTD, Oct. 31, 1995.*
Bruel, M. et al., "Smart-Cut": A Promising New SOI Material Technology, IEEE SOI Conference, Oct. 1995, pp 178-179.
Maleville et al., "Wafer Bonding and H-Implantation Mechanisms Involved In The Smart-Cut Technology", Materials Science and Engineering, 1997, pp. 14-19.
A. J. Auberton-Hervé et al., "Why Can SMART-CUT® Change the Future of Microelectronics?", International Journal of High Speed Electronics and Systems, vol. 10, No. 1, 2000, pp 131-146.
"Thermal and Dopant Processes", Chapter 4, Advanced Semiconductor Fabrication Handbook, ICE, 1998.

* cited by examiner

*Primary Examiner*—Walter L. Lindsay, Jr.
(74) *Attorney, Agent, or Firm*—Winston & Strawn LLP

(57) ABSTRACT

The invention concerns a method of preparing the surface of a semiconductor wafer intended for microelectronics and/or optoelectronics applications. In particular, a method of preparing a SiC surface of a semiconductor wafer to make it epiready is described. The technique includes annealing the wafer in an oxidizing atmosphere, and polishing a surface of the wafer with an abrasive based on particles of colloidal silica to make the SiC wafer surface suitable for homoepitaxy or heteroepitaxy.

19 Claims, 1 Drawing Sheet

METHOD OF PREPARING A SURFACE OF A SEMICONDUCTOR WAFER TO MAKE IT EPIREADY

BACKGROUND ART

The present invention generally relates to the treatment of semiconductor materials intended for microelectronics and/or optoelectronics applications. In particular, it relates to a method of preparing the surface of a thin film having a thickness in the range of about 1 nanometer (nm) or a few tens of nm to about 100 nm or a few hundred nm, for example 400 nm or 500 nm. More particularly, the invention relates to preparing the surface of a film of monocrystalline silicon carbide so that it is "epiready", meaning that the surface is ready for epitaxy, i.e., to receive growth of an epitaxial film thereon. In an implementation, the film may be a silicon carbide film transferred onto a further material (silicon, monocrystalline or polycrystalline SiC covered with an oxide or other film such as deposited oxide, nitride, etc).

In order to obtain good quality epitaxy, the starting surface must be free of defects and must be as smooth as possible. A thin layer transfer method is known for transferring thin SiC films, and is known as the SMART-CUT® process (or substrate fracture method). This well known method is described, for example, in an article by A. J. Auberton-Hervé et al entitled "Why Can SMART-CUT® Change the Future of Microelectronics?", International Journal of High Speed Electronics and Systems, Vol. 10, no. 1, 2000, pages 131–146. After detachment, that method results in a roughness value of about 5 nm root mean square (rms), which is not compatible with epitaxial growth. The roughness value must be reduced to about 1 nm to 2 nm rms by applying thermal oxidation-type treatments (known as annealing) and/or ion etching. However, it has been observed that such techniques cannot produce the desired final roughness value (of 0.1 to 0.2 nm rms) for epitaxy on SiC.

The annealing step does not consume sufficient material to significantly reduce the roughness value since thermal SiC oxidation is very slow, especially on the silicon face. Further, it is difficult to conduct chemical-mechanical polishing (CMP) of SiC since the chemical reactivity of the polished surfaces is low compared with materials such as silicon. In addition, the removal rate is very low, on the order of 10 nm per hour, as compared to about 50 nm per minute for silicon polishing. Further, the mechanical hardness of SiC is extremely high and the use of "diamond" abrasives or certain other abrasives that are known for polishing silicon may result in scratches. Thus, it is difficult to find an abrasive to use which results in a sufficiently high removal rate without creating scratches and defects. Hence, SiC polishing methods are often very lengthy (several hours). Further, abrasives based on diamond particles cannot produce the desired roughness of less than 1 nm rms. For these two reasons, SiC polishing techniques are very precise, and few SiC substrate polishing methods are known.

U.S. Pat. No. 5,895,583 describes a polishing method that uses several successive steps. Several steps are necessary to remove work hardened zones generated by each polishing step. That method uses abrasives based on diamond-containing particles having decreasing diameters.

French patent application No. 02-09869 describes a method employing a mixture of abrasives (diamond/silica) that can produce roughness compatible with molecular bonding.

Techniques other than polishing exist that are capable of producing a low roughness surface. The majority of such techniques are based on bombarding the surface with ions from a plasma (RIE) or a beam (for example gas cluster ion beam), a technique that is described in U.S. Pat. No. 6,537,606. Such techniques are of interest concerning the removal rates, but the surface condition is often too rough for epitaxy, and in particular, the surface cannot be easily smoothed.

Thus, there is a need to develop a method of treating or preparing the surface of a film, in particular a silicon carbide film. It would also be beneficial to find a method of treating films, in particular silicon carbide films, that can produce low roughness, and/or that can produce a sufficient removal rate without creating scratches or defects. It would also be advantageous to develop a method of treating silicon carbide films which can produce low roughness, preferably of less than 15 angstroms (Å), or 10 Å rms or 5 Å rms or 1 Å rms, which are compatible with epitaxial growth.

SUMMARY OF THE INVENTION

The invention relates to a method for preparing a surface of a semiconductor wafer so that it is epiready. The technique includes annealing the wafer in an oxidizing atmosphere to condition the surface; and polishing the conditioned surface of the wafer with an abrasive based on particles of colloidal silica in order to provide a wafer surface that is suitable for growing an epitaxial layer thereon. Advantageously, the wafer surface is prepared so that it is suitable for homoepitaxy or heteroepitaxy. In a preferred embodiment, the surface of the wafer comprises SiC, such as in the form of a SiC surface layer that is bonded to a semiconductor substrate.

In a preferred embodiment, the annealing is conducted at a temperature in the range of about 1000° C. to about 1300° C., and more preferably at about 1150° C. Annealing is generally conducted for about 1 hour to about 3 hours. The method may further include at least one of deoxidizing the wafer surface or utilizing an RCA (SC1, SC2) type chemical cleaning step. This is generally conducted after annealing and prior to polishing. Hydrofluoric acid may be used to deoxidize the wafer surface. The method may also advantageously includes chemically cleaning the wafer surface prior to polishing, wherein hydrofluoric acid may be used for cleaning. If desired, the wafer surface can be etched with ions prior to polishing.

A preferred type of colloidal silica for polishing the wafer surface is SYTON W30 type colloidal silica. Also, it is desirable to use a polishing head rotating at a rate in the range of about 10 rpm to about 100 rpm to polish, optionally with a pressure in the range of about 0.1 bar to about 1 bar applied to the polishing head. Polishing typically occurs for a period in the range of about 15 minutes to about 30 minutes. If desired, an IC1000 type polishing pad can be used.

An advantageous aspect of the includes annealing the wafer in an oxidizing atmosphere and then inserting the wafer into a polishing head. Next, a liquid abrasive based on colloidal silica can be applied or injected onto the wafer surface, and then applying a pressure and a movement to the polishing head to polish the wafer surface against a polishing pad.

The invention utilizes steps and machines that are standard in microelectronics to rapidly provide an epiready semiconductor surface. The invention is particularly advantageous when applied to SiC substrates, for example of polytype 4H, which are used for epitaxial growth, and can be used to fabricate electronic power components.

BRIEF DESCRIPTION OF THE FIGURES

Other aspects, purposes and advantages of the invention will become clear after reading the following description with reference to the attached drawings, in which.

DETAILED DESCRIPTION OF THE PREFERRED EMBODIMENTS

An implementation is described below that relates to the silicon face of a SiC film. It should be noted that SiC is a polar material, and thus includes two faces composed of different atoms (a silicon face and a carbon face). The thin film is, for example, obtained by a substrate fracture method (the SMART-CUT® process) such as that described in the above-cited article by A. J. Auberton-Hervé et al.

A heat treatment is first carried out on the thin film in an oxidizing atmosphere, for example, at a temperature in the range of about 1000° C. or about 1150° C. to about 1300° C. for a period in the range of from about 1 hour to about 3 hours. This annealing step in an oxidizing atmosphere can produce a surface roughness of on the order of about 2 nm rms. One example of a device for carrying out the annealing step is described in "Thermal and Dopant Processes", Chapter 4, Advanced Semiconductor Fabrication Handbook, ICE, 1998.

The treated surface can be deoxidized by chemical etching, for example, by using 10% hydrofluoric (HF) acid. A chemical-mechanical polishing (CMP) step is then subsequently conducted, for example, by using an IC1000 pad (which is distributed by the RODEL company, having a compressibility of about 3%) and an abrasive based on colloidal silica SYTON W30 (or LuDox) type particles (pH=10.2, viscosity=2 megapascal.seconds (mPs.s), mean particle size=125 nm, containing 30% $SiO_2$ by weight).

Figure 1A:
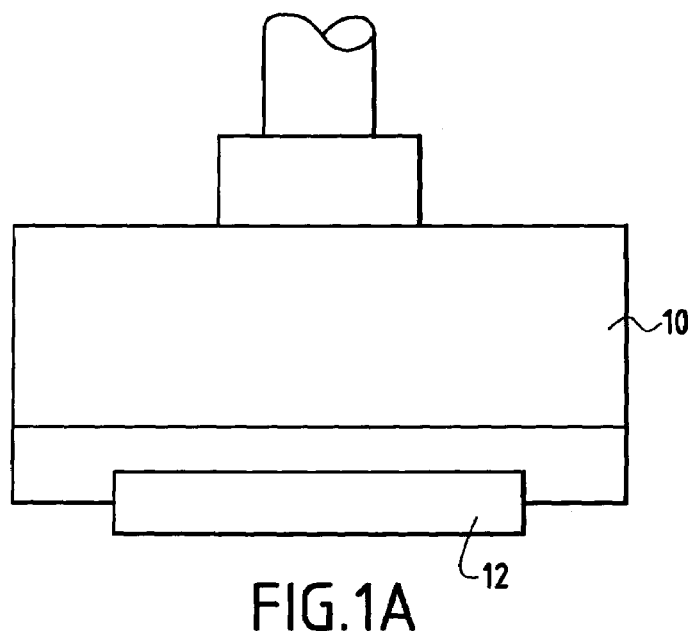
FIGS. 1A and 1B are diagrams of an embodiment of a polishing apparatus according to the invention.
Figure 1B:
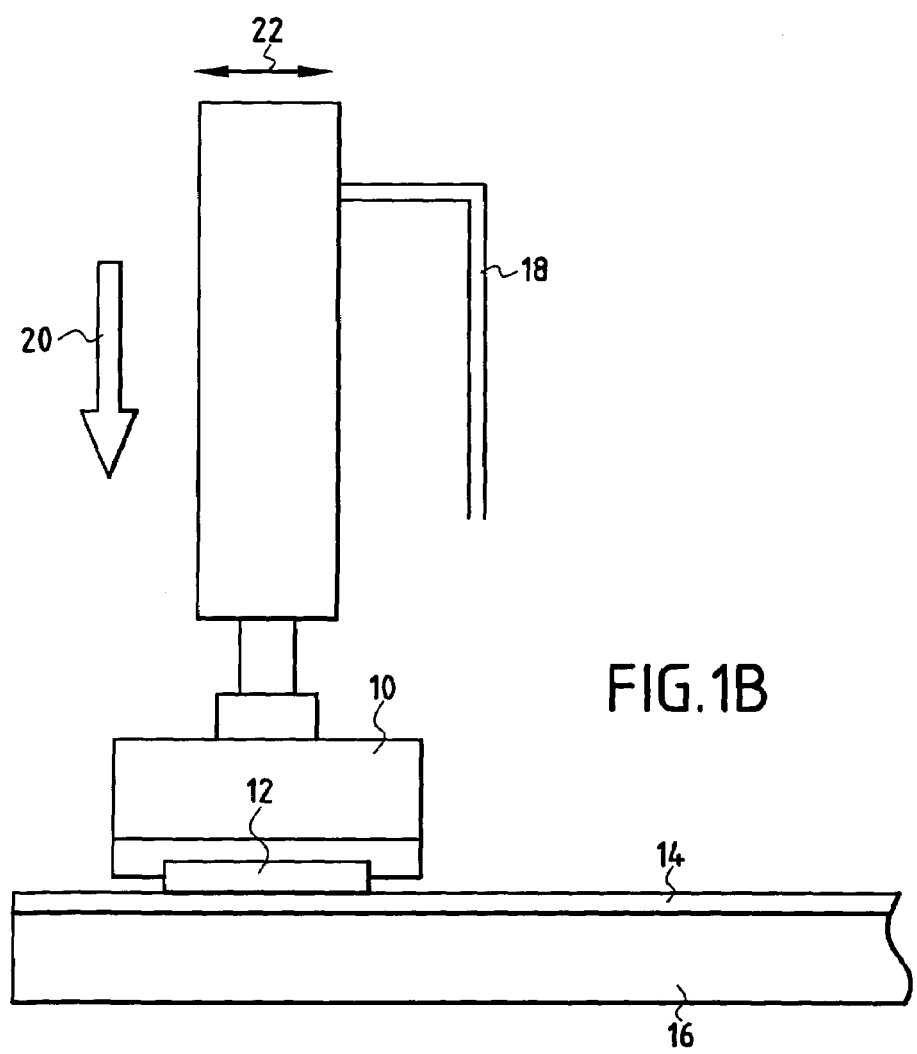

FIG. 1A shows a substrate 12 inserted into a polishing head 10. FIG. 1B shows the polishing head 10, the substrate 12 to be polished, a plate 16 and a polishing pad 14. A liquid abrasive is injected into the head, for example, via a side conduit 18. Pressure 20 along with a side-to-side movement represented by an arrow 22 are applied to the head 10 to carry out polishing. Optionally, chemical cleaning using hydrofluoric acid may be used to prevent crystallization of the abrasive on the surface. This method can produce a surface with a suitable roughness that enables it to be used for good quality homoepitaxy (SiC on SiC epitaxy), and optionally also heteroepitaxy (AlN, AlGaN or GaN on SiC).

EXAMPLE

The following is an example relating to a thin film of a 4H type SiC (obtained by the SMART-CUT® method). An annealing step was carried out in an oxidizing atmosphere (for example, for 2 hours at 1150° C.), followed by surface deoxidation in 10% HF followed by polishing the surface by CMP. Polishing was carried out with the use of a rotating polishing plate onto which a polishing head had been applied, also rotating, the speed of rotation being of the order of 60 revolutions per minute (rpm) with a pressure of 0.75 bars applied to the head. The pad used was a "hard" type IC1000 pad distributed by the RODEL company, with a slurry which was a SYTON W30-type colloidal silica.

The polishing time was about 15 minutes (min) to about 30 min, and the roughness obtained after polishing was on the order of about 3 Å rms. Final cleaning carried out using deionized water with a 10% HF bath for 10 minutes.

Table I below summarizes the results obtained for thin SiC films under different conditions.

TABLE I

| I | II | III | IV | V (nm) | VI |
|---|---|---|---|---|---|
| 1 | None | | | 5.02 | |
| 2 | Ion etching + anneal 1150° C., time: 2 h | | | 3.02 | |
| 3 | Ion etching + anneal 1150° C., time: 2 h | 30 min/70 rpm/ 0.75 b | UR 100/ glansox | 0.583 | soft pad |
| 4 | Anneal 1150° C., time: 2 h | 30 min/60 rpm/ 0.75 b | UR 100/ glansox | 1.246 | soft pad |
| 5 | Anneal 1150° C., time: 2 h + ion etching | | | 1.12 | |
| 6 | Anneal 1150° C., time: 2 h | | | 2.54 | annealing sufficient to reduce roughness |
| 7 | Anneal 1300° C., time: 1 h | | | 1.64 | |
| 8 | Anneal 1150° C., time: 2 h | 15 min/25 rpm/ 0.6 b | IC1000/syt on | 0.267 | Fairly slow speed of rotation |
| 9 | Anneal 1150° C., time: 2 h | 30 min/60 rpm/ 0.75 b | IC1000/syt on | 0.101 | |
| 10 | Anneal 1150° C., time: 2 h | 15 min/60 rpm/ 0.75 b | IC1000/syt on | 0.155 | worn pad |
| 11 | Anneal 1150° C., time: 2 h | 15 min/60 rpm/ 0.75 b | IC1000/syt on | 0.064 | new pad |

In the table, column I indicates the test number and column II shows the nature of the treatment carried out prior to CMP polishing. Tests 2 and 3 underwent ion etching followed by annealing at 1150° C. for two hours; for test number 5, the treatment was annealing at 1150° C. for two hours followed by ion etching. For tests 4, 6 and 8 to 10, only annealing at 1150° C. for two hours was carried out.

Column III gives the conditions for carrying out CMP polishing including the time, rotation speed, and applied pressure.

Column IV shows the nature of the pad and the abrasive mixture.

Column V shows roughness measurements over a surface area of 5 micrometers (μm)×5 μm.

Comments are shown in column VI.

Table I shows that the combination of an annealing step followed by polishing can substantially reduce the roughness of the initial film to less than 2 nm rms (see tests 3–5 and 7–11), 1.5 nm (see tests 3–5 and 8–11), 1 nm rms (tests 3 and 8–11), 0.5 nm rms (tests 8–11), or 0.1 nm rms (test 11). Thus, the invention can produce a silicon carbide film with a roughness of less than 2 nm rms, less than 1 nm rms, less than 0.5 nm rms, or less than 0.1 nm rms. Use of prior ion etching, as in test number 3, also improves the result.

The best results appear to be obtained with an IC1000 pad and with a Syton W30 abrasive solution.

Table II below shows more detailed conditions concerning test numbers 10 and 11. In particular, test number 10 was carried out using an "S107" plate while test number 11 was carried out using an "S126" plate, and Table II compares roughness values using the S126 and S107 plates.

Two types of measurements were carried out: scanning a certain surface area (column S, surface area indicated in square micrometers (μm$^2$)), and point measurements (column B, surface measurements indicated in μm×μm).

The last three columns show, in angstroms: roughness as a root mean square value (rms), mean roughness (Ra), and maximum roughness (Rmax)

The values shown in Table I for tests 10 and 11 respectively correspond to those shown in the third and seventh lines of Table II (rms column).

TABLE II

| Comparison of roughness using plates S126 and S107 | | | | | |
|---|---|---|---|---|---|
| Plate | S (μm$^2$) | B μm | rms (Å) | Ra (Å) | Rmax (Å) |
| S107 | 1 μm × 1 μm | | 0.97 | 0.77 | 14.7 |
| | | 0.3 × 0.9 | 0.7 | 0.55 | 8.2 |
| | 5 μm × 5 μm | | 1.55 | 1.21 | 16.1 |
| | | 3 × 1 | 1.38 | 1.06 | 12.1 |
| S126 | 1 μm × 1 μm | | 0.37 | 0.28 | 7 |
| | | 0.6 × 0.7 | 0.34 | 0.27 | 3 |
| | 5 μm × 5 μm | | 0.64 | 0.5 | 29.7 |
| | | 1.5 × 4 | 0.31 | 0.25 | 4.9 |

The results shown in these tables indicate that the method according to the invention can produce a surface that is ready for epitaxy ("epiready") on thin SiC films, using a rapid technique, which employs steps and machines that are standard in microelectronics. The smoother the SiC surface and the lower its roughness, the better the quality of the epitaxy, which can substantially increase the yield of electronic components produced on the thin film. The surface preparation method of the invention, comprising an annealing step followed by polishing, can thus produce a good quality surface that is not rough and is smooth.

The example of a polytype 4H SiC substrate has been used herein, but it should be noted that the invention is also preferred for us with other SiC substrates, such as a polytype 6H substrate or to a 3C SiC substrate.

What is claimed is:

1. A method of preparing a SiC surface of a semiconductor wafer to make it epiready which comprises:
    annealing the wafer in an oxidizing atmosphere to condition the SiC surface;
    treating the wafer surface to reduce surface roughness; and
    polishing the treated and conditioned SiC surface of the wafer with an abrasive based on particles of colloidal silica in order to provide a wafer surface that is suitable for growing an epitaxial layer thereon;
    wherein the wafer is annealed under conditions sufficient to produce a surface roughness that is on the order of about 2 nm rms and the polishing step is conducted to achieve a surface roughness that is on the order of about 3 Å rms.

2. The method of claim 1 wherein the SiC surface layer is bonded to a semiconductor substrate.

3. The method of claim 1 wherein the annealing is conducted at a temperature of about 1000° C. to about 1300° C.

4. The method of claim 1 the wafer surface is treated by a deoxidizing step or by applying an RCA (SC1, SC2) type chemical cleaning step prior to polishing.

5. The method of claim 4 wherein the wafer surface is deoxidized with hydrofluoric acid.

6. The method of claim 1 wherein the treating step comprises chemically cleaning the wafer surface.

7. The method of claim 6 wherein the wafer surface is cleaned with hydrofluoric acid.

8. The method of claim 1 wherein the colloidal silica particles used for polishing the wafer surface include SYTON W30 type colloidal silica.

9. The method of claim 1 wherein the polishing is conducted with a polishing head that is rotated at about 10 rpm to about 100 rpm.

10. The method of the claim 9 which further comprises applying a pressure of about 0.1 bar to about 1 bar to the polishing head during rotation.

11. The method of claim 1 which further comprises polishing the wafer surface for about 15 minutes to about 30 minutes.

12. The method claim 1 wherein the polishing is conducted with an IC1000 type polishing pad.

13. The method of claim 1 wherein the polishing is conducted to make the wafer surface suitable for homoepitaxy or heteroepitaxy.

14. The method of claim 1 wherein the polishing is conducted to provide a surface roughness of less than 15 angstroms RMS.

15. The method of claim 1 which further comprises depositing an epitaxial layer upon the polished wafer surface.

16. The method of claim 15 wherein the epitaxial layer comprises at least one of SiC, AlN, GaN, or AlGaN.

17. The method of claim 1 wherein the conditioned surface is treated to prevent crystallization of abrasive during the polishing step.

18. A method of preparing a SiC surface of a semiconductor wafer to make it epiready which comprises:
    annealing the wafer in an oxidizing atmosphere to condition the SiC surface; and
    polishing the conditioned SiC surthee of the wafer with an abrasive based on particles of colloidal silica in order to provide a wafer surface tax is suitable for growing an epitaxial layer thereon,
    wherein the annealing is conducted for about 1 hour to about 3 hours.

19. A method of preparing a SiC surface of a semiconductor wafer to make it epiready which comprises:
    annealing the wafer in an oxidizing atmosphere to condition the SiC surface;
    polishing the conditioned SiC surface of the wafer with an abrasive based on particles of colloidal silica in order to provide a wafer surface that is suitable for growing an epitaxial layer thereon; and
    etching the wafer surface with ions prior to polishing.

* * * * *

UNITED STATES PATENT AND TRADEMARK OFFICE
CERTIFICATE OF CORRECTION

PATENT NO. : 7,060,620 B2
APPLICATION NO. : 10/671812
DATED : June 13, 2006
INVENTOR(S) : Richtarch It is certified that error appears in the above-identified patent and that said Letters Patent is hereby corrected as shown below:

Column 6:
Line 12, after "The method of claim 1" insert -- wherein --.
Line 51, after "polishing the conditioned SiC" delete "surthee" and insert -- surface --.
Line 53, after "provide a wafer surface" delete "tax" and insert -- that --.

Signed and Sealed this

Fifteenth Day of August, 2006

JON W. DUDAS
*Director of the United States Patent and Trademark Office*